(12) United States Patent
Bombelli et al.

(10) Patent No.: US 11,283,411 B2
(45) Date of Patent: Mar. 22, 2022

(54) METHOD FOR MAKING A WIDEBAND DOHERTY AMPLIFIER WITH REDUCED PLAN WIDTH AND AMPLIFIER THEREOF

(71) Applicant: GatesAir, Inc., Mason, OH (US)

(72) Inventors: Carlo Bombelli, Roncadelle (IT); Silvio Coradi, Brescia (IT)

(73) Assignee: GatesAir, Inc., Mason, OH (US)

( * ) Notice: Subject to any disclaimer, the term of this patent is extended or adjusted under 35 U.S.C. 154(b) by 0 days.

(21) Appl. No.: 16/931,071

(22) Filed: Jul. 16, 2020

(65) Prior Publication Data
US 2021/0050821 A1    Feb. 18, 2021

(30) Foreign Application Priority Data
Jul. 17, 2019    (IT) .................. 102019000011967

(51) Int. Cl.
*H03F 1/02*    (2006.01)
*H03F 1/56*    (2006.01)
*H03F 3/195*   (2006.01)

(52) U.S. Cl.
CPC ........... *H03F 1/0288* (2013.01); *H03F 1/565* (2013.01); *H03F 3/195* (2013.01);
(Continued)

(58) Field of Classification Search
CPC ........ H03F 1/0288; H03F 1/565; H03F 3/195; H03F 2200/192; H03F 2200/423; H03F 2200/451
(Continued)

(56) References Cited

U.S. PATENT DOCUMENTS

| | | |
|---|---|---|
| 2012/0092074 A1 | 4/2012 | Yanduru et al. |
| 2012/0105147 A1 | 5/2012 | Harris et al. |
| 2019/0363683 A1* | 11/2019 | Kamitani et al. ......... H03F 3/19 |
| | | 330/295 |

FOREIGN PATENT DOCUMENTS

EP    3 496 269 A1    6/2019

OTHER PUBLICATIONS

Al-Kazzaz,Design and Implementation of Doherty Power Amplifier of Global System Mobile (GSM) of Base station, Al-Rafidain Engineering, vol. 20 No. 6, Dec. 2012. (Year: 2012).*

(Continued)

*Primary Examiner* — Hafizur Rahman
(74) *Attorney, Agent, or Firm* — Calfee, Halter & Griswold LLP (57) ABSTRACT

A method for making a wideband Doherty amplifier with reduced plan width, adapted to transport a radio-frequency signal at a frequency value comprised within a frequency range defined between a minimum frequency value and a maximum frequency value, the amplifier including: a signal source adapted to generate an input signal; a hybrid coupler or a splitter network adapted to receive the input signal and divide it into first and second output signals phase-shifted by 90°; a carrier amplifier adapted to receive as input the first output signal; a peak amplifier adapted to receive as input the second output signal; an output network arranged between the carrier and peak amplifiers and a delivery node adapted to be connected to a load, the output network including a recombination node adapted to receive the signals output by the carrier amplifier and the peak amplifier, and a transmission line implemented as a printed circuit track applied to an insulating substrate, wherein capacitors are inserted on the track which are adapted to compensate (Continued)

for the non-ideality characteristics of the semiconductor used for making the line.

6 Claims, 8 Drawing Sheets

(52) U.S. Cl.
CPC .. *H03F 2200/192* (2013.01); *H03F 2200/423* (2013.01); *H03F 2200/451* (2013.01)

(58) Field of Classification Search
USPC .......................................................... 330/295
See application file for complete search history.

(56) References Cited

OTHER PUBLICATIONS

Italian Search Report dated Mar. 5, 2020, issued in IT Application No. 201900011967.
Extended European Search Report from European Patent Application No. 20186275.2 dated Dec. 7, 2020.

* cited by examiner

//METHOD FOR MAKING A WIDEBAND DOHERTY AMPLIFIER WITH REDUCED PLAN WIDTH AND AMPLIFIER THEREOF

BACKGROUND OF THE INVENTION

1. The Field of the Invention

The present invention relates to a method for making a wideband Doherty amplifier with reduced plan width, as well as to such an amplifier.

2. The Relevant Technology

In order to avoid introducing signal alterations, signal amplifiers, and particularly those employed for amplifying width-modulated signals, must have high linearity throughout the whole usable passband of the signal taken into consideration from time to time.

Signals requiring particularly high linearity include all those signal types with digital modulation which are used by all the standards currently known for radio and television broadcasting.

Before the advent of the Doherty configuration, the signal amplifier modules available on the market, or anyway those which could actually be physically realized, were characterized by a definitely unsatisfactory efficiency, well below 30% and often below 20%.

This poor efficiency not only implies a particularly high energy consumption (compared with the gain introduced by the module in question), but also translates into the necessity of removing from such amplifier module, and then dissipating, a considerable amount of heat, resulting in an oversized cooling/conditioning system and additional costs incurred for the energy required for operating such a system.

For example, with an efficiency of 20%, an amplifier with an output power of 10,000 W will draw 50,000 W from the electric network, and will require the installation and operation of a cooling system capable of dissipating 40,000 W.

In conditioning systems, it can be conjectured that the power consumption will increase by approximately 20,000 W. Therefore, the system equipment necessary for obtaining a usable power of 10,000 W will imply a power consumption of 70,000 W, with an "actual" efficiency (evaluated over all the necessary system equipment) of approximately 14%.

The Doherty configuration makes it possible to significantly increase the efficiency of amplification systems: in particularly accurate implementations, it may reach values in excess of 45%.

In the above-considered example, a Doherty amplifier with an efficiency of 45% and an output power of 10,000 W will draw from the electric network a power of approximately 22,000 W, and will require the installation and operation of a cooling system capable of removing and dissipating approximately 12,000 W.

In conditioning systems, it can be conjectured that the power consumption will increase by approximately 6,000 W. Therefore, the system equipment necessary for obtaining a usable power of 10,000 W will imply a power consumption of 28,000 W, with an "actual" efficiency (evaluated over all the necessary system equipment) of approximately 36%.

The advantage is clear. However, due to the physical principles it is based on, the implementation of a Doherty circuitry requires the use of additional physical space compared with standard configurations.

Commercial amplification systems must nevertheless comply with specific dimensional constraints. Let us consider, by way of example, an amplification system intended for use in a radio or television signal broadcasting chain. In order to optimize the space available in equipment rooms and to rationalize the wirings, the market has universally adopted the solution of installing in equipment rooms frames or racks with standardized dimensions and distance between posts.

The various elements that make up the entire system equipment of a broadcasting station, including the amplification systems, must be inserted and installed within these frames, which are universally available from many manufacturers. Such frames, which typically extend vertically, are normalized in accordance with the EIA-310 rack standard.

A rack unit, abbreviated as U (or, less frequently, RU or HU, Height Unit), is a unit of measure indicating the height of components installed in a 19-inch or 23-inch rack. One rack unit corresponds to 1.75 inches or 44.45 mm.

In manufacturers' specifications, an apparatus which is one rack unit tall is often indicated as "1U", and indications such as "2U", "4U", etc. are used for taller units. This makes it very easy to calculate the necessary space occupation.

It follows that, in order to achieve product marketability, a manufacturer of amplification systems cannot freely establish the dimensions thereof either in a plan view or in height, but has to observe the above-mentioned strict dimensional constraints.

A manufacturer wanting to make a Doherty amplification system, which, as aforementioned herein, requires more physical space than a traditional configuration, will therefore have to choose whether to reduce the power output and maintain the same dimensions or to keep the power at the price of more space occupation. Since the plan dimensions of the apparatuses is fixed (i.e., equal to the plan dimensions of the frames compliant with the EIA-310 standard), the manufacturer can only increase their height, thus occupying more rack units.

This results in a decreased number of apparatuses which can be installed in a single frame, leading to various criticalities in the equipment rooms at broadcasting sites, which may even need to be enlarged. However, in some cases an enlargement may not be feasible because the equipment rooms are located underground or on top of towers, etc.

Figure 1A:
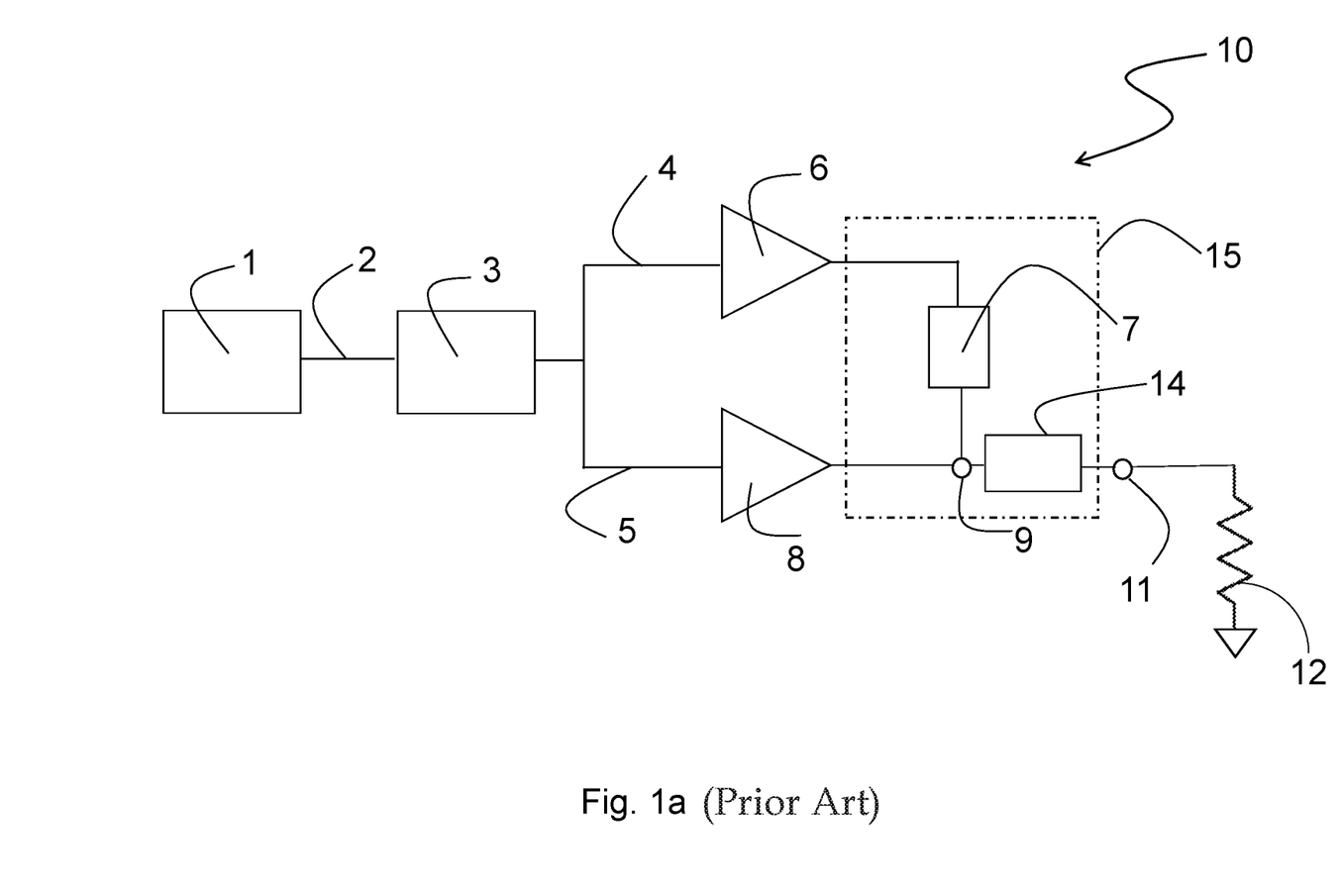
FIG. 1a is a block diagram of a prior-art Doherty amplifier in the classical configuration.

FIG. 1a shows a block diagram of a prior-art Doherty amplifier 10 with a classical configuration. An input signal 2, generated by a signal source 1, is split into two separate output signals 4,5 phase-shifted by 90° by means of a hybrid coupler 3 or a suitable splitter network.

The two output signals 4,5 are then applied to the input of two respective different amplifiers 6,8, which, being differently polarized (typically the amplifier 6 has Class-AB polarization for the carrier and the amplifier 8 has Class-C polarization for the peak), must then be recombined to recover the phase difference applied to the input.

To do so, a delay line 7 of electric length equal to ¼ of the wave of the frequency of the input signal 2 is normally used, which, in addition to the correct phase, also ensures insulation between the two amplifiers 6,8 by acting as an impedance inverter.

Such delay line 7 is disposed downstream of the stage of the carrier amplifier 6 (as shown in FIG. 1a) and is typically made by using a suitably shaped and sized track applied to an insulating substrate, according to the known printed circuit technique.

The signal thus amplified then flows from a recombination node 9 (at a typically low impedance e.g., approx. 2Ω), which is located downstream of the carrier amplifier 6 and of the peak amplifier 8, to a delivery node 11 adapted to be connected to a load 12 (typically at 50Ω), which is located downstream of the recombination node 9. With reference to the above-mentioned typical values, the impedance is transformed from approx. 2Ω to 50Ω by a transformation line 14 situated between the recombination node 9 and the delivery node 11.

An output network 15, situated between the carrier and peak amplifiers 6,8 and the delivery node 11, comprises therefore the delay line 7 and the transformation line 14.

Figure 1B:
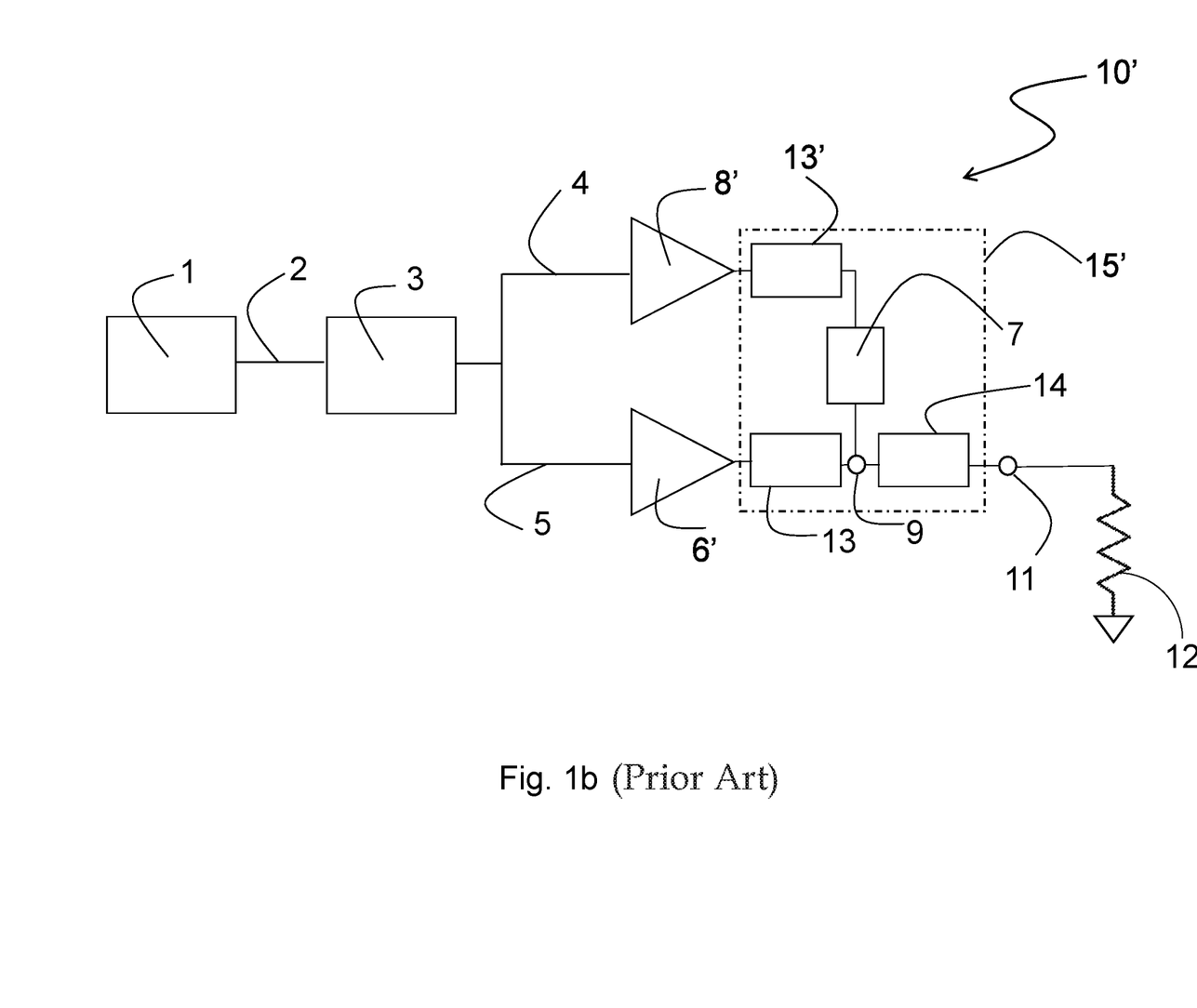
FIG. 1b is a block diagram of a prior-art Doherty amplifier in the inverted configuration.

FIG. 1b shows a block diagram of a prior-art Doherty amplifier 10' with an inverted configuration. An input signal 2, generated by a signal source 1, is split into two separate output signals 4,5 phase-shifted by 90° by means of a hybrid coupler 3 or a suitable splitter network.

The two output signals 4,5 are then applied to the input of two respective different amplifiers 6',8', which, being differently polarized (typically the amplifier 6' has Class-AB polarization for the carrier and the amplifier 8' has Class-C polarization for the peak), must then be recombined to recover the phase difference applied to the input.

To do so, a delay line 7 of electric length equal to ¼ of the wave of the frequency of the input signal 2 is normally used, which, in addition to the correct phase, also ensures insulation between the two amplifiers 6',8' by acting as an impedance inverter.

Such delay line 7 is disposed downstream of the stage of the peak amplifier 8' (as shown in FIG. 1b) and is typically made by using a suitably shaped and sized track applied to an insulating substrate, according to the known printed circuit technique.

There are also a first offset line 13', disposed downstream of the peak amplifier 8' and upstream of the delay line 7, and a second offset line 13, disposed downstream of the carrier amplifier 6' and upstream of a recombination node 9.

Both the first offset line 13' and the second offset line 13 have an electric length equal to ½ of the wave of the frequency of the input signal 2.

The first offset line 13' and the delay line 7 are often considered as a single delay line 7 or, likewise, as a single offset line 13', having an electric length equal to ¾ of the wave of the frequency of the input signal 2.

The signal thus amplified then flows from the recombination node 9 (at a typically low impedance e.g., approx. 2Ω), which is located downstream of the carrier amplifier 6' and of the peak amplifier 8', to a delivery node 11 adapted to be connected to a load 12 (typically at 50Ω), which is located downstream of the recombination node 9. With reference to the above-mentioned typical values, the impedance is transformed from approx. 2Ω to 50Ω by a transformation line 14 situated between the recombination node 9 and the delivery node 11.

An output network 15', situated between the carrier and peak amplifiers 6',8' and the delivery node 11, comprises therefore the first delay line 7, the first offset line 13', the second offset line 13 and the transformation line 14.

Figure 1C:
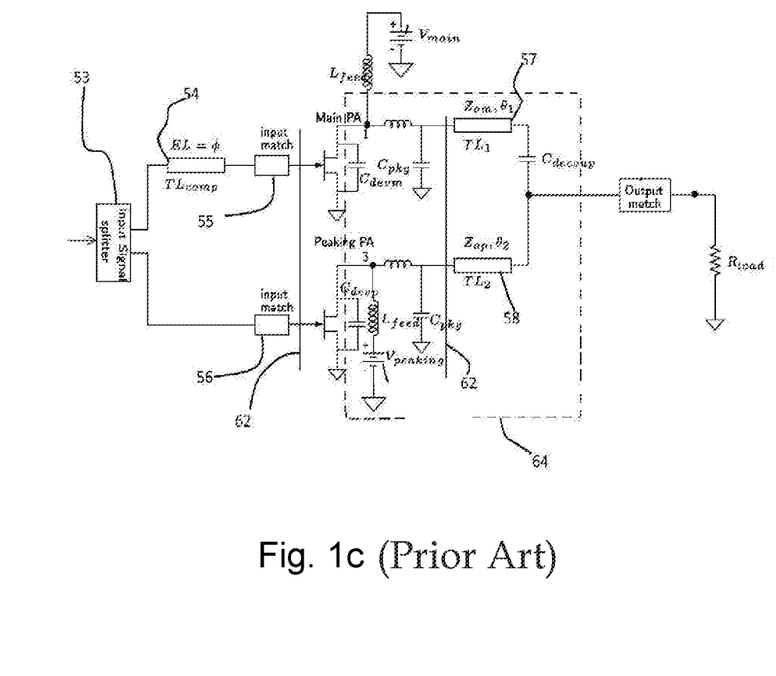
FIGS. 1c and 1d illustrate two respective circuit configurations of prior-art Doherty amplifiers.

In a particular circuit design known from United States patent application no. US 2014/0347133, proposed by semiconductor manufacturer Ampleon/NXP and illustrated in FIG. 1c, two phase-shifting lines are inserted both downstream of the carrier stage ("Main") and downstream of the peak stage ("Peaking") for the purpose of making an ultra wideband amplification module.

Said two phase-shifting lines must be sized and designed in such a way as to take into account the non-ideality characteristics of the amplifier circuits. The parasitic capacities and the additional non-ideality contributions that characterize the considered semiconductor being known, since they are specified by the manufacturer, the two phase-shifting lines, designated in FIG. 1c by numerals 57 and 58, are sized and designed to represent, while taking into account all the inherent non-ideality elements of the considered semiconductor, a phase-shifting line 57 having an electric length of $\lambda/4$ and a phase-shifting line 58 having an electric length of $\lambda/2$.

The insertion of these two lines also implies a circuit modification. Imagining to modify the circuit diagram of FIG. 1a according to the teaching of said United States patent application, the radio-frequency output of the modified circuit will no longer be situated at the end of the line 7 corresponding to the peak amplifier, but at the end which corresponds to the carrier amplifier 6. As a matter of fact, such two phase-shifting lines constitute an impedance inverter.

Figure 1D:
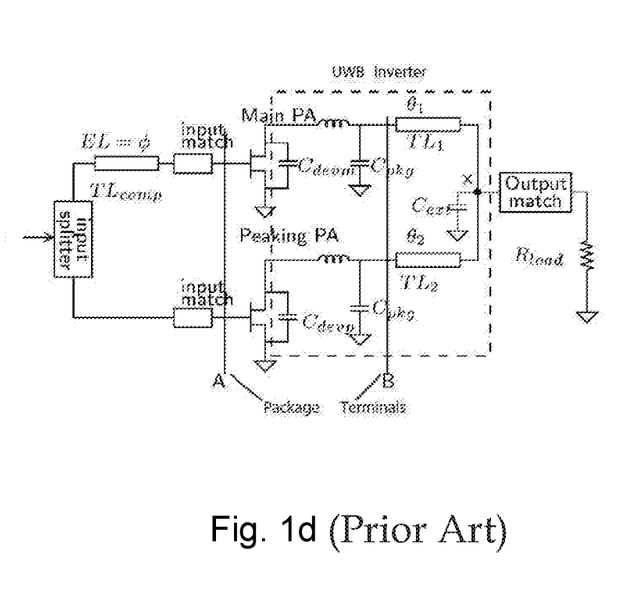

The design proposed in document "Ampleon's Ultra Wideband Doherty (UWB) for TV Transmitters White Paper" by B. Goumas and P. Forth, September 2016, illustrated in FIG. 1d, requires the additional insertion of a discrete capacity $C_{ext}$ at the ends of the two phase-shifting lines 57 and 58 for the purpose of symmetrizing and "centering" the response of the amplification module.

The Doherty circuit, which in its traditional configuration requires the insertion of a phase-shifting line having an electric length equal to $\lambda/4$, requires therefore, in both configurations proposed by Ampleon/NXP, two further offset lines. As a result, the total electric length of the three lines, i.e., two offset lines and one phase-shifting line, reaches considerable values.

All other conditions being equal, the electric length of a phase-shifting line is proportional to the physical length of the lines themselves; it follows that the implementation of a traditional Doherty configuration, and particularly of the Doherty configuration proposed by Ampleon/NXP, requires much room in the amplification module. As previously described, this is disadvantageous for certain applications, like those requiring the installation of equipment into standard-size racks.

SUMMARY OF THE INVENTION

It is therefore an object of the present invention to provide a method for making a wideband Doherty amplifier and such an amplifier which make it possible to reduce the plan width necessary for realizing such an amplifier on a printed circuit board.

This and other objects of the present invention are achieved through a method for making a wideband Doherty amplifier with reduced plan width and such an amplifier as claimed in the appended claims, which are an integral part of the present invention.

In brief, the present invention aims at reducing the physical length of the phase-shifting lines of a Doherty amplifier while preserving the electric length of the same, for the purpose of obtaining a reduced size of the amplifier module in a plan view, all other features remaining the same, thus making it possible to attain a higher output power through a circuit occupying the same space, while taking into account the constraints imposed by the standardization of the layout dimensions of the apparatuses.

Depending on the configuration of the Doherty amplifier taken into consideration, i.e., whether classical or inverted, it is possible to reduce the physical length of one or more of the transmission lines in $\lambda/4$, or $\lambda/2$, and of the transformation line.

Therefore, it is possible to reduce the physical length of the delay line 7 and/or of the first offset line 13' and/or of the second offset line 13' and/or of the transformation line 14.

Further advantageous features of the present invention are set out in the appended claims, which are an integral part of the description.

BRIEF DESCRIPTION OF THE DRAWINGS

Further features and advantages of the present invention will become more apparent from the following description of an embodiment thereof as shown in the annexed drawings, which are supplied merely by way of non-limiting example, wherein.

DETAILED DESCRIPTION OF THE PREFERRED EMBODIMENTS

Figure 2A:
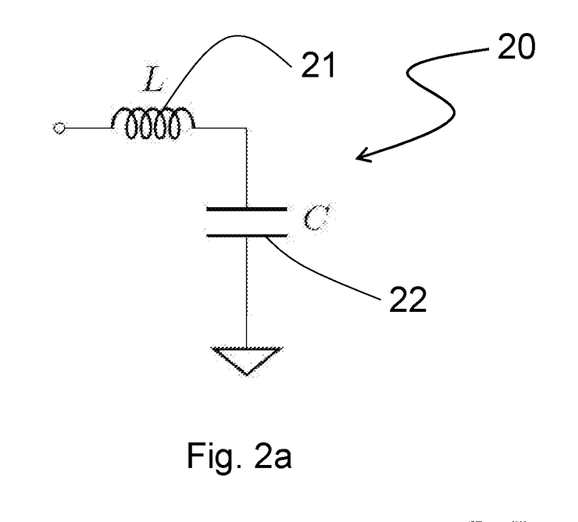
FIGS. 2a, 2b and 2c illustrate, respectively, three equivalent circuits of a tract of infinitesimal length of a transmission line in case of negligible losses.

With reference to FIG. 2a, there is shown a first simplified equivalent circuit 20 of a tract of infinitesimal length of a transmission line having negligible losses, such as, for example, the delay line 7 or the first offset line 13' or the second offset line 13 or the transformation line 14 of the Doherty amplifier 10 of FIGS. 1a or 1b, comprising an inductance 21 of value L in series with a capacitor 22 of value C.

In case of negligible resistive loss, the electric impedance Z and the electric length EL of the tract of infinitesimal length are respectively given, therefore, by the following formulae:

$$Z_1 = \sqrt{\frac{L}{C}} \qquad (1)$$

$$EL = \omega l\sqrt{LC} \qquad (2)$$

where l is the physical length of the line and $\omega = 2\pi f$, where f is the frequency of the signal that flows through the line.

Figure 2B:
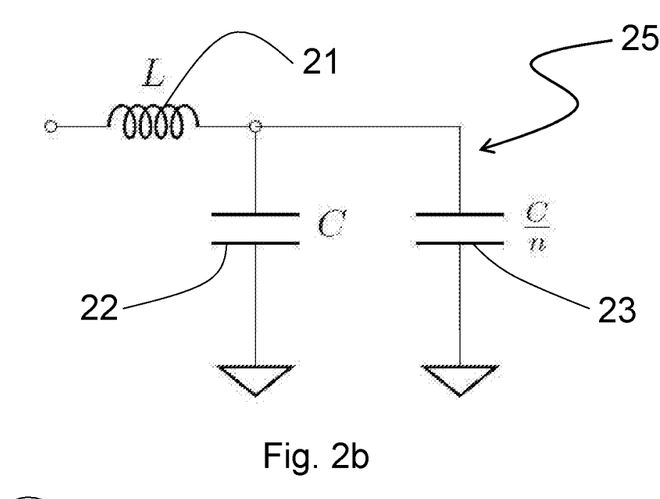

With reference to FIG. 2b, there is shown a second circuit 25 identical to the one shown in FIG. 2a save for the addition, in parallel with the capacitor 22 of value C, of a second capacitor 23 of value C/n, where n is a number greater than zero belonging to the set of real numbers, e.g., the set of natural numbers.

The equivalent capacity $C_{eq}$ of the second circuit 25 is given, therefore, by the formula:

$$C_{eq} = C\left(\frac{n+1}{n}\right) \qquad (3)$$

The introduction of the second capacitor 23 involves a variation in both the impedance $Z_2$ and the electric length $EL_2$ of the second circuit 25 in comparison with the first circuit 20. Using the formulae (1) and (2), one thus obtains that:

$$Z_2 = \sqrt{\frac{L}{C}\left(\frac{n}{n+1}\right)} \qquad (4)$$

$$EL_2 = \omega l\sqrt{LC\left(\frac{n+1}{n}\right)} \qquad (5)$$

In order to restore the original value of the electric length of the first circuit 20, it is possible to change the value of the inductance 21 of the second circuit 25 by suitably multiplying it by a factor $$\left(\frac{n}{n+1}\right).$$

Figure 2C:
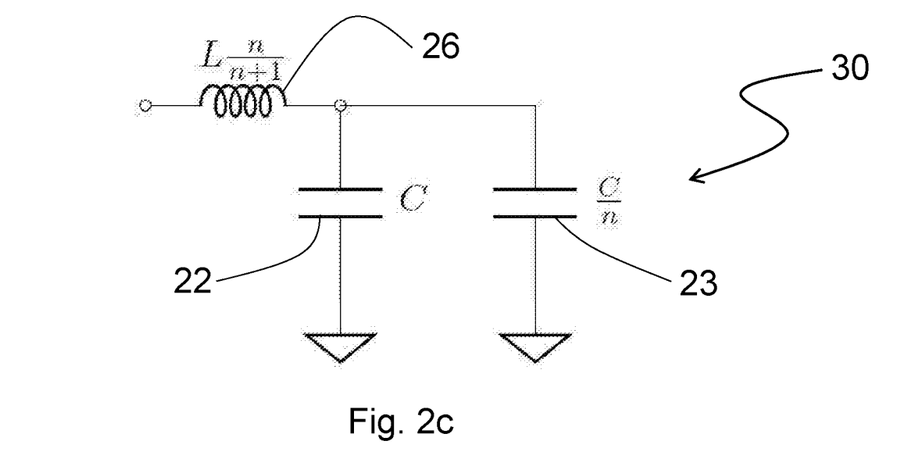

A third circuit 30 will thus be obtained, which is shown in FIG. 2c, where the values of the impedance $Z_3$ and of the electric length $EL_3$ are expressed, again by applying the formulae (1) and (2), as:

$$Z_3 = \sqrt{\frac{L}{C}}\left(\frac{n}{n+1}\right) \qquad (6)$$

$$EL_3 = \omega l\sqrt{LC} \qquad (7)$$

It can then be observed that the third circuit 30 has the same electric length as the first circuit 20, but a different impedance.

In order to calculate the mismatching introduced by the impedance variation between the first circuit 20 and the third circuit 30, the following formula can be applied:

$$\Gamma = \frac{Z_3 - Z_1}{Z_3 + Z_1} \qquad (8)$$

With some simple mathematical passages, and defining RL=−20 logΓ, the following Return Loss RL will be obtained:

$$RL = -20\log\left|\frac{-1}{2n+1}\right| \qquad (9)$$

Figure 3:
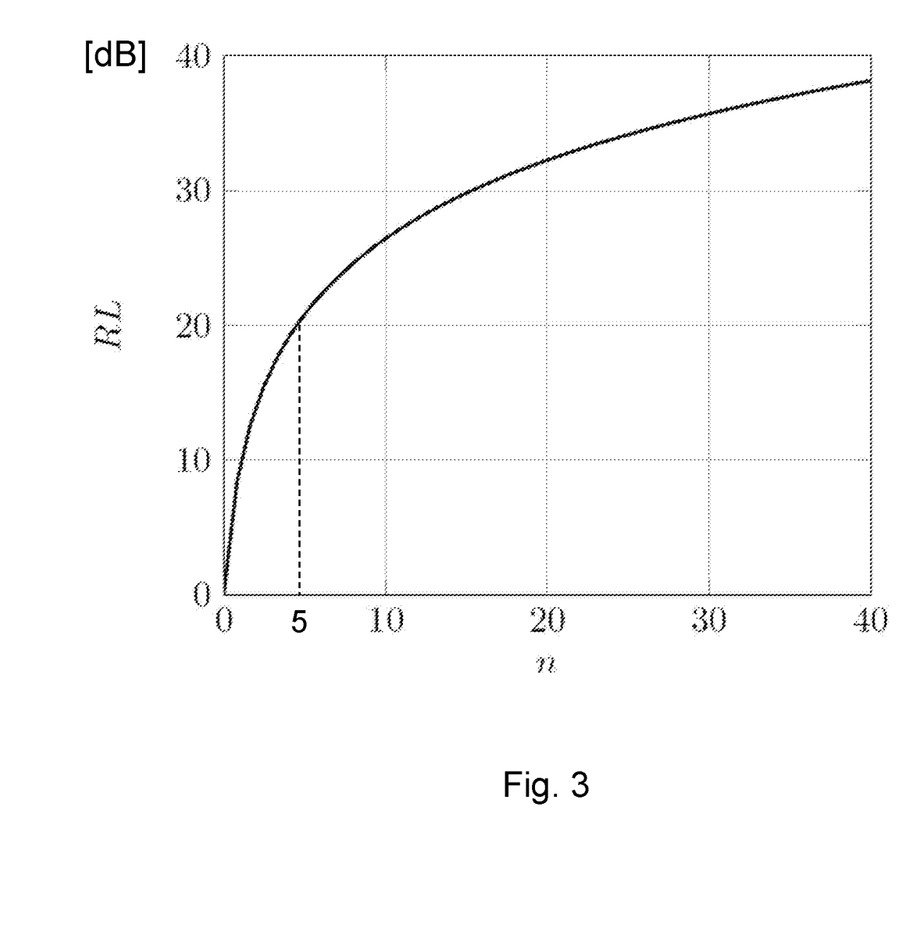
FIG. 3 shows a graph representing the impedance mismatching introduced by the circuit addition of a capacitor to a transmission line of a wideband Doherty amplifier in accordance with the method of the present invention.

FIG. 3 shows the graph of the Return Loss RL as a function of the value n. The value n represents, therefore, an index indicating the extent to which the inductance, and hence the line length, can be reduced to detriment of the impedance matching. The circuit designer can thus choose a value n that will allow obtaining a mismatching considered as acceptable. Such mismatching will essentially imply a variation in the impedance at the recombination node 9 of the circuit of FIG. 1a or FIG. 1b compared with the case wherein no capacitor is added to the circuit.

From the graph of FIG. 3 it can be inferred that, e.g., considering 20 dB as an acceptable mismatching, n=5. In this example, therefore, the value of the capacitor that needs to be added to each infinitesimal tract of the transmission line taken into consideration is equal to C/5.

Figures 4A, 4B, 4C:
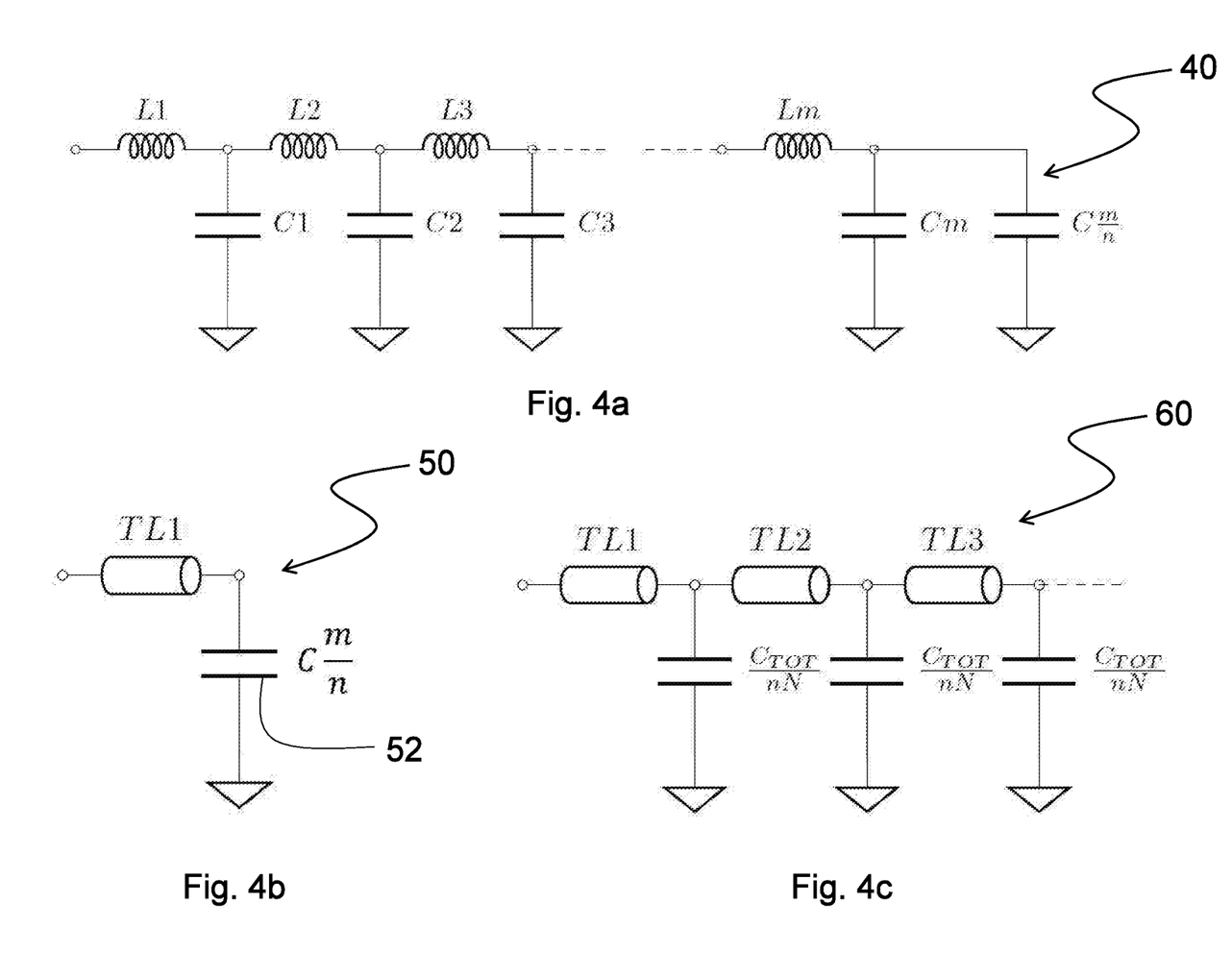
FIGS. 4a, 4b and 4c illustrate, respectively, three circuits representative of a transmission line.

Now, instead of adding a capacitor having a value equal to C/n to each infinitesimal tract of the transmission line, it is conceivable to add one capacitor every m infinitesimal tracts, as in a fourth circuit 40 shown in FIG. 4a. Based on the above description, the value of the capacitor to be added to the fourth circuit 40 will have to be equal to $C \cdot (m/n)$.

The fourth circuit 40 of FIG. 4a is equivalent to a fifth circuit 50 of FIG. 4b that comprises a transmission line $TL_1$ and a capacitor 52 having a value $C \cdot (m/n)$. Having analyzed infinitesimal tracts and defined C' as the capacity per length unit of the transmission line TL1 of the fifth circuit 50, the following relationship applies:

$$C = \int_0^l C' \, dl \qquad (10)$$

where l represents the physical length of the transmission line TL1 of the fifth circuit 50.

If C' is a constant value, C=C'l, which, as previously stated, equals C·m because m infinitesimal tracts have been considered.

The fifth circuit 50 of FIG. 4b is essentially a low-pass filtering element having a cut-off frequency $f_c$ that can be obtained by means of the following empirical formula (assuming that the impedance of TL1 is $Z_0$, i.e., the characteristic impedance of the transmission line):

$$f_c = \frac{1}{\pi Z_0 \dfrac{C_{TOT}}{n}} = \frac{1}{\pi Z_0 \dfrac{C' \cdot l_{max}}{n}} \qquad (11)$$

where $C_{TOT}$ depends on the length of the transmission line $TL_1$ and amounts to $C' \cdot l_{max}$.

Referring back to the Doherty amplifier 10 of FIG. 1, it operates within a certain frequency range, or passband, defined between a minimum frequency $f_{min}$ and a maximum frequency $f_{max}$. As the length of the line grows, the value $C_{TOT}$ increases, and hence $f_c$ decreases.

With a view to avoiding any malfunctions of the amplifier 10, it is necessary to impose that the cut-off frequency $f_c$ is outside the passband. The maximum operating frequency being known, this will limit the line length to the value $l_{max}$ that can be obtained from the equation (11).

In fact, the equation (11) can be solved with respect to $l_{max}$ because:
- the value n is defined by the designer;
- the cut-off frequency $f_c$ is imposed by the designer;
- the characteristic impedance $Z_0$ of the transmission line TL1 can be determined by means of suitable simulation software;
- the capacity C' per length unit of the transmission line TL1 can be determined by means of suitable simulation software or convenient tables.

The value $l_{max}$ corresponds, therefore, to the maximum distance at which two successive capacitors can be arranged in order to obtain a cut-off frequency higher than the upper end of the passband of the amplifier 10.

Indicating a step length as $l_{STEP}$, and given the total length $l_{TOT}$ of the transmission line, a number of steps $n_{passi}$ can be obtained as $l_{TOT}/l_{STEP}$, where $l_{STEP} \leq l_{max}$.

The capacitor to be added at each step length will thus have a value equal to $C_{TOT}/(n \cdot n_{passi})$.

In this way, a physical length of the matching line is obtained which is shorter than in the prior art, so that the plan width of the wideband Doherty amplifier can be reduced. In fact, it is possible to reduce the physical length of the delay line 7 and/or of the first offset line 13' and/or of the second offset line 13 and/or of the transformation line 14.

The impedance mismatching which is found at the recombination node 9 of the circuit of FIG. 1a or FIG. 1b can thus be advantageously compensated for by appropriately sizing the delay line 7 and/or the first offset line 13' and/or the second offset line 13 and/or the transformation line 14.

A generic representation of a transmission line (which in the circuits of FIGS. 1a or 1b may be the delay line 7 and/or the first offset line 13' and/or the second offset line 13 and/or the transformation line 14) modified by inserting some capacitors in accordance with the method of the present invention is illustrated in the circuit 60 of FIG. 4c, where N is the number of capacitors inserted between line tracts TL1, TL2 and TL3, and $C_{TOT}$ is the total capacity of the circuit 60.

$C_{TOT}$ includes both the parasitic capacities which are peculiar to the semiconductor and the capacities inserted in accordance with the method of the present invention.

The value and the number of the inserted capacitors should be chosen by the designer on the basis of the operating frequency of the wideband Doherty amplifier, of the extent to which the physical dimensions of the line need to be reduced, and of the physical complexity introduced in the circuit by the capacitors.

Preferably, the capacitors should be distributed at a regular mutual distance along the transmission line, so as to ensure symmetry and approximate at best the above-described electric behaviours.

Nevertheless, the capacitors may also be inserted empirically at irregular mutual distances, should any mounting problems or difficulties make it necessary to choose a different arrangement, while still fulfilling the constraint $L_{STEP} \leq l_{max}$.

Likewise, if a given value of one or each unitary capacitor to be added to the circuit results in an operating frequency close to the resonance frequency of that particular capacitor, it will be possible to divide such capacitor into multiple capacitors equivalent to the unitary capacitor, to be positioned at a suitable distance in compliance with the above-described conditions.

Figure 5:
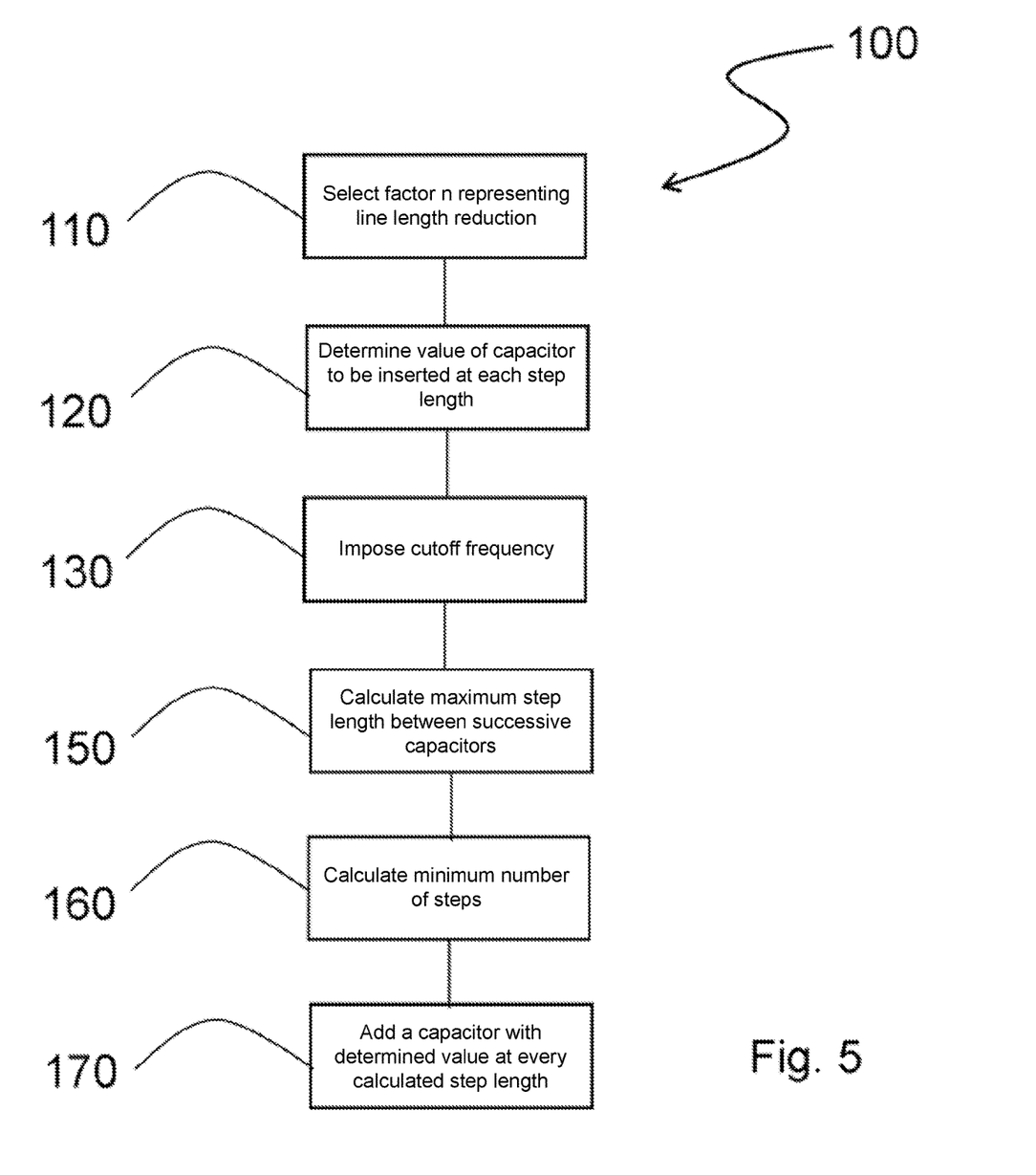
FIG. 5 shows a block diagram of a method for making a wideband Doherty amplifier according to the present invention.
Figure 6:
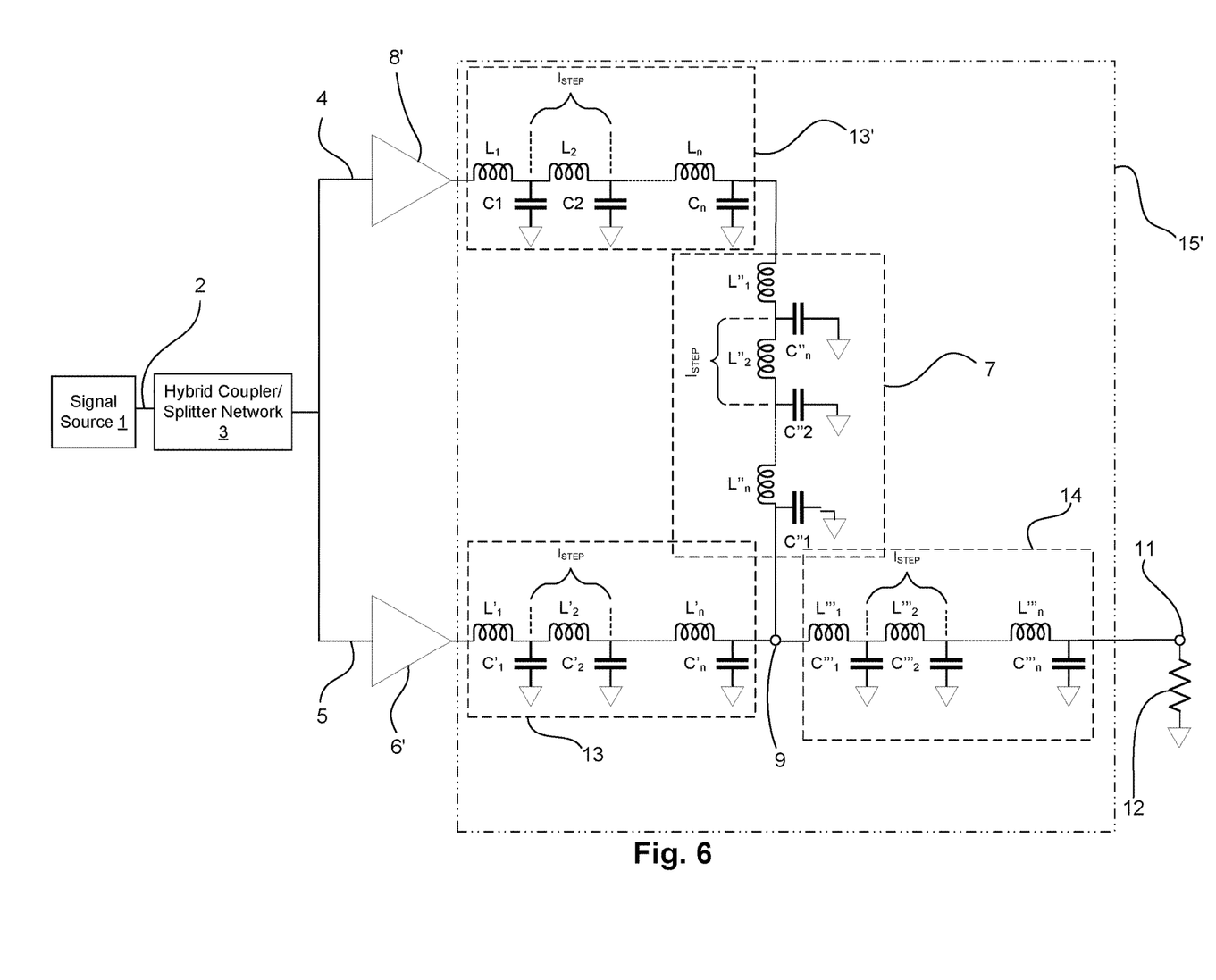
FIG. 6 is a block diagram of a Doherty amplifier according to the present invention.

With reference to FIG. 5, the following will describe a method 100 which can be used by a designer in order to make a wideband Doherty amplifier having a reduced plan width in comparison with the prior art.

At step 110, a factor n is selected which is representative of the reduction in the physical length of the delay line 7 and/or of the first offset line 13' and/or of the second offset line 13 and/or of the transformation line 14 to detriment of the impedance matching of the line itself. In practice, having available the graph of FIG. 3, the designer selects a value of n by taking into account the maximum tolerable mismatching indicated by the Return Loss variable RL in the graph of FIG. 3.

At step 120, a value is determined for the capacitor C that should be inserted at each step length $L_{STEP}$, which will be defined by the designer at the next step 160, of the transmission line.

At step 130, a cut-off frequency $f_c$ is imposed, which must be positioned outside the passband of the amplifier, i.e., having a value which is higher than the maximum operating frequency $f_{max}$ of the amplifier, wherein $f_{max}$ is a design specification.

At step 150, by means of the equation (11) the value $l_{max}$ is obtained, which is the maximum step length at which it is possible to position two successive capacitors for the cut-off frequency $f_c$ to be higher than the maximum operating frequency $f_{max}$ of the amplifier.

At step 160, the minimum number of steps $n_{passi}=l_{TOT}/l_{STEP}$ is obtained at which a capacitor must be inserted in the transmission line, where $l_{STEP} \leq l_{max}$ and $l_{TOT}$ is the length of the delay line 7 and/or of the first offset line 13' and/or of the second offset line 13 and/or of the transformation line 14.

At step 170, a capacitor having the value $C_{TOT}/(n \cdot n_{passi})$ is added at every step length $L_{STEP}$.

Since the delay line 7, the first offset line 13', the second offset line 13 and the transformation line 14 are made by using suitably shaped and sized tracks applied to an insulating substrate in accordance with the known printed circuit technique, in order to implement the method of the present invention it is necessary to insert or add one or more capacitors on a track associated with the line the physical length of which is to be reduced. For example, this is practically achieved by soldering the capacitors onto the track.

The method according to the present invention is therefore applicable to one or more of the transmission lines of the output network 15,15' of the Doherty amplifier, i.e., to the delay line 7, the transformation line 14, the first offset line 13' and the second offset line 13.

The method for making a wideband Doherty amplifier with reduced plan width and such amplifier described herein by way of example may be subject to many possible variations without departing from the novelty spirit of the inventive idea; it is also clear that in the practical implementation of the invention the illustrated details may have different shapes or be replaced with other technically equivalent elements.

It can therefore be easily understood that the present invention is not limited to a method for making a wideband Doherty amplifier and to such wideband Doherty amplifier with reduced plan width described herein by way of example, but may be subject to many modifications, improvements or replacements of equivalent parts and elements without departing from the inventive idea, as clearly specified in the following claims.

The invention claimed is:

1. A method for making a wideband Doherty amplifier with reduced plan width, adapted to transport a radio-frequency signal at a frequency value comprised within a frequency range defined between a minimum frequency value and a maximum frequency value, said amplifier comprising:
   a signal source adapted to generate an input signal;
   means, in particular a hybrid coupler or a splitter network, adapted to receive said input signal and divide it into first and second output signals phase-shifted by 90°;
   a carrier amplifier adapted to receive as input said first output signal;
   a peak amplifier adapted to receive as input said second output signal;
   an output network arranged between said carrier and peak amplifiers and a delivery node adapted to be connected to a load, said output network comprising a recombination node adapted to receive the signals output by said carrier amplifier and said peak amplifier, and a transmission line implemented as a printed circuit track applied to an insulating substrate, said method comprising the steps of:
a) determining an index n indicative of a mismatching considered as acceptable of an impedance value at said recombination node;
b) determining a total capacity of said transmission line;
c) determining a total inductance of said transmission line from said total capacity and from a cut-off frequency of said wideband Doherty amplifier, imposing that said cut-off frequency is higher than said maximum frequency value;
d) based on said total inductance and on the material of said track and said insulating substrate of said transmission line, determining a maximum distance at which two capacitors should be inserted on said transmission line;
e) determining a minimum number of steps where to locate one or more capacitors based on the total length of said line and a step length, imposing that said step length is shorter than or equal to said maximum distance;
f) inserting on said track of said transmission line one or more capacitors based on said minimum number of steps, said one or more capacitors having a capacity value equal to said total capacity divided by the product of said minimum number of steps and said index n.

2. The method for making a wideband Doherty amplifier according to claim 1, wherein said capacitors are inserted so as to be distributed at a constant mutual distance along said transmission line.

3. The method for making a wideband Doherty amplifier according to claim 1, wherein said capacitors are inserted at an irregular mutual distance along said transmission line.

4. The method according to claim 1, wherein at least one of said inserted capacitors is replaced by a plurality of capacitors having the same capacity as said at least one capacitor.

5. The method according to claim 1, wherein said transmission line comprises one of the following lines:
   a delay line, arranged between said carrier amplifier and said peak amplifier, having an electric length equal to ¼ of a wave of the frequency of said input signal;
   a transformation line arranged between said recombination node and said delivery node;
   a first offset line, arranged between said peak amplifier and said transmission line, having an electric length equal to ¼ of a wave of the frequency of said input signal;
   a second offset line, arranged between said carrier amplifier and said recombination node, having an electric length equal to ¼ of a wave of the frequency of said input signal.

6. A Wideband Doherty amplifier with reduced plan width, adapted to transport a radio-frequency signal at a frequency value comprised within a frequency range defined between a minimum frequency value and a maximum frequency value, said amplifier comprising:
   a signal source adapted to generate an input signal;
   means, in particular a hybrid coupler or a splitter network, adapted to receive said input signal and divide it into first and second output signals phase-shifted by 90°;
   a carrier amplifier adapted to receive as input said first output signal;
   a peak amplifier adapted to receive as input said second output signal;
   an output network arranged between said carrier and peak amplifiers and a delivery node adapted to be connected to a load, said output network comprising a recombination node adapted to receive the signals output by said carrier amplifier and said peak amplifier and a transmission line implemented as a printed circuit track applied to an insulating substrate, said amplifier being characterized in that it comprises one or more capacitors arranged on said track of said transmission line in accordance with the method according to claim 1.

* * * * *